United States Patent
Yeh

(10) Patent No.: US 8,606,988 B2
(45) Date of Patent: Dec. 10, 2013

(54) FLASH MEMORY CONTROL CIRCUIT FOR INTERLEAVINGLY TRANSMITTING DATA INTO FLASH MEMORIES, FLASH MEMORY STORAGE SYSTEM THEREOF, AND DATA TRANSFER METHOD THEREOF

(75) Inventor: Chih-Kang Yeh, Kinmen County (TW)

(73) Assignee: Phison Electronics Corp., Miaoli (TW)

( * ) Notice: Subject to any disclaimer, the term of this patent is extended or adjusted under 35 U.S.C. 154(b) by 752 days.

(21) Appl. No.: 12/542,137

(22) Filed: Aug. 17, 2009

(65) Prior Publication Data
US 2010/0318724 A1 Dec. 16, 2010

(30) Foreign Application Priority Data

Jun. 16, 2009 (TW) ................................ 98120090 A

(51) Int. Cl.
G06F 12/02 (2006.01)
G06F 12/06 (2006.01)
G11C 11/56 (2006.01)
(52) U.S. Cl.
CPC ........ *G06F 12/0246* (2013.01); *G06F 12/0607* (2013.01); *G11C 11/5628* (2013.01)
USPC 711/103; 365/185.03; 711/157; 711/E12.079
(58) Field of Classification Search
None
See application file for complete search history.

(56) References Cited

U.S. PATENT DOCUMENTS

| 8,228,728 | B1* | 7/2012 | Yang et al. ............... 365/185.03 |
| 2005/0015539 | A1* | 1/2005 | Horii et al. ................. 711/103 |
| 2008/0320214 | A1* | 12/2008 | Ma et al. ....................... 711/103 |
| 2010/0011158 | A1* | 1/2010 | Shiraishi et al. .............. 711/103 |
| 2010/0318839 | A1* | 12/2010 | Avila et al. .................... 714/5 |
| 2010/0325342 | A1* | 12/2010 | Honda .......................... 711/103 |
| 2011/0035538 | A1* | 2/2011 | Kim et al. ..................... 711/103 |

FOREIGN PATENT DOCUMENTS

| CN | 2676291 | 2/2005 |
| WO | 2009013879 | 1/2009 |

OTHER PUBLICATIONS

Yan Li et al. "A 16 Gb 3-Bit Per Cell (X3) NAND Flash Memory on 56 nm Technology With 8 MB/s Write Rate." Dec. 2008. IEEE. IEEE Journal of Solid-State Circuits. vol. 4. pp. 195-207.*

* cited by examiner

*Primary Examiner* — Nathan Sadler
(74) *Attorney, Agent, or Firm* — J.C. Patents

(57) ABSTRACT

A flash memory control circuit including a microprocessor unit, a first interface unit, a second interface unit, a buffer memory, a memory management unit, and a data read/write unit is provided. The memory management unit manages a plurality of flash memory units, wherein each of the flash memory units has a plurality of flash memories, each of the flash memories has a plurality of memory cell arrays, and each of the memory cell arrays at least has an upper page and a lower page. The memory management unit groups the memory cell arrays of the corresponding flash memories into a plurality of data transfer unit sets (DTUSs). The data read/write unit interleavingly transfers data to the flash memory units in units of the DTUSs. Thereby, the flash memory control circuit can transfer the data stably and the usage of the buffer memory can be reduced.

4 Claims, 10 Drawing Sheets

| memory cell array | lower page | Middle page | Upper page | lower page | Middle page | Upper page | memory cell array |
|---|---|---|---|---|---|---|---|
| 0th | 0 | 1 | 2 | 96 | 97 | 98 | 32nd |
| 1st | 3 | 4 | 5 | 99 | 100 | 101 | 33rd |
| 2nd | 6 | 7 | 8 | 102 | 103 | 104 | 34th |
| 3rd | 9 | 10 | 11 | 105 | 106 | 107 | 35th |
| 4th | 12 | 13 | 14 | 108 | 109 | 110 | 36th |
| 5th | 15 | 16 | 17 | 111 | 112 | 113 | 37th |
| 6th | 18 | 19 | 20 | 114 | 115 | 116 | 38th |
| 7th | 21 | 22 | 23 | 117 | 118 | 119 | 39th |
| 8th | 24 | 25 | 26 | 120 | 121 | 122 | 40th |
| 9th | 27 | 28 | 29 | 123 | 124 | 125 | 41st |
| 10th | 30 | 31 | 32 | 126 | 127 | 128 | 42nd |
| 11th | 33 | 34 | 35 | 129 | 130 | 131 | 43rd |
| 12th | 36 | 37 | 38 | 132 | 133 | 134 | 44th |
| 13th | 39 | 40 | 41 | 135 | 136 | 137 | 45th |
| 14th | 42 | 43 | 44 | 138 | 139 | 140 | 46th |
| 15th | 45 | 46 | 47 | 141 | 142 | 143 | 47th |
| 16th | 48 | 49 | 50 | 144 | 145 | 146 | 48th |
| 17th | 51 | 52 | 53 | 147 | 148 | 149 | 49th |
| 18th | 54 | 55 | 56 | 150 | 151 | 152 | 50th |
| 19th | 57 | 58 | 59 | 153 | 154 | 155 | 51st |
| 20th | 60 | 61 | 62 | 156 | 157 | 158 | 52nd |
| 21st | 63 | 64 | 65 | 159 | 160 | 161 | 53rd |
| 22nd | 66 | 67 | 68 | 162 | 163 | 164 | 54th |
| 23rd | 69 | 70 | 71 | 165 | 166 | 167 | 55th |
| 24th | 72 | 73 | 74 | 168 | 169 | 170 | 56th |
| 25th | 75 | 76 | 77 | 171 | 172 | 173 | 57th |
| 26th | 78 | 79 | 80 | 174 | 175 | 176 | 58th |
| 27th | 81 | 82 | 83 | 177 | 178 | 179 | 59th |
| 28th | 84 | 85 | 86 | 180 | 181 | 182 | 60th |
| 29th | 87 | 88 | 89 | 183 | 184 | 185 | 61st |
| 30th | 90 | 91 | 92 | 186 | 187 | 188 | 62nd |
| 31th | 93 | 94 | 95 | 189 | 190 | 191 | 63rd |

FIG. 2

FLASH MEMORY CONTROL CIRCUIT FOR INTERLEAVINGLY TRANSMITTING DATA INTO FLASH MEMORIES, FLASH MEMORY STORAGE SYSTEM THEREOF, AND DATA TRANSFER METHOD THEREOF

CROSS-REFERENCE TO RELATED APPLICATION

This application claims the priority benefit of Taiwan application serial No. 98120090, filed on Jun. 16, 2009. The entirety of the above-mentioned patent application is hereby incorporated by reference herein and made a part of specification.

BACKGROUND

1. Technology Field

The present invention relates to a flash memory control circuit, a flash memory storage system, and a data transfer method, wherein the usage of a buffer memory is effectively reduced and the time for writing data into a flash memory is effectively shortened.

2. Description of Related Art

The consumers' demand to storage media has increased drastically along with the widespread of digital cameras, cell phones, and MP3 in recent years. Flash memory is one of the most adaptable memories for such battery-powered portable products due to its characteristics such as data non-volatility, low power consumption, small volume, and non-mechanical structure. A solid state drive (SSD) is a storage device which uses a NAND flash memory as its storage medium.

A flash memory in a flash memory storage device has a plurality of physical blocks, and each of the physical blocks has a plurality of pages, wherein data is written into a physical block according to the sequence of these pages.

Generally speaking, the process for writing data into a page can be divided into a data transferring phase and a data programming phase. To be specific, when data is to be stored into a page of a flash memory, a control circuit of the flash memory storage device transfers the data into a buffer area of the flash memory. Then, the flash memory programs the data from the buffer area into the page. The flash memory is in a busy status when it programs the data into the page. The control circuit cannot give any command or transfer any data to the flash memory when the flash memory is in the busy status.

In addition, a flash memory can be categorized as a single level cell (SLC) NAND flash memory or a multi level cell (MLC) NAND flash memory according to the number of bits which each memory cell can store. The physical blocks in a MLC NAND flash memory are programmed in multiple phases. Taking a 2-level cell NAND flash memory as an example, the physical blocks thereof are programmed in 2 phases. During the first phase, data is written into lower pages, wherein the physical characteristic of a lower page is similar to that of a SLC NAND flash memory. After the first phase, data is written into upper pages, wherein the write speed of the lower pages is faster than that of the upper pages. Similarly, in an 8-level cell NAND flash memory or a 16-level cell NAND flash memory, each memory cell has more pages and accordingly data is written into these memory cells in more phases.

Conventionally, in order to increase the write speed of a flash memory storage device, multiple flash memories are usually disposed in the flash memory storage device and data is written into these flash memories in an interleaving manner. Taking a flash memory storage device disposed with a first flash memory and a second flash memory as an example, when a host system is about to write a plurality of page data (i.e., data greater than 1 page) into the flash memory storage device, the control circuit transfers one of the page data to the first flash memory. When the first flash memory is in the busy status, the control circuit transfers another page data to the second flash memory. After that, when the second flash memory is in the busy status, the control circuit transfers yet another page data to the first flash memory. As described above, the control circuit transfers the page data to the first flash memory and the second flash memory in an interleaving manner, so that the time for writing the page data is shortened. In foregoing example of the MLC NAND flash memory, when the page data is being written into the upper pages of the first flash memory and the second flash memory (i.e., the first flash memory and the second flash memory are on the busy status), the control circuit has to wait for a long time (i.e., until the data writing process to one of the first flash memory and the second flash memory is completed) before it can continue to transfer data to the first flash memory or the second flash memory. During this period, the host system continues to transfer data to the flash memory storage device. Accordingly, a buffer memory has to be disposed in the flash memory storage device for temporarily storing the data transferred by the host system. Along with the increase in the number of levels of a MLC NAND flash memory, the time for programming some pages is prolonged so that a buffer memory with greater capacity has to be disposed.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a flash memory control circuit, wherein data can be stably transferred to a plurality of flash memories so that the usage of a buffer memory is reduced.

The present invention is also directed to a flash memory storage system, wherein data can be stably transferred to a plurality of flash memories so that the usage of a buffer memory is reduced.

The present invention is further directed to a data transfer method, wherein data can be stably transferred to a plurality of flash memories so that the usage of a buffer memory is reduced.

According to an exemplary embodiment of the present invention, a flash memory control circuit is provided to transfer data from a host system to a plurality of flash memory units. Each of the flash memory units has at least one flash memory, the flash memory has a plurality of memory cell arrays, and each of the memory cell arrays at least has a lower page and an upper page, wherein the write speed of the lower page is faster than that of the upper page. The flash memory control circuit includes a microprocessor unit, a first interface unit, a second interface unit, a buffer memory, a memory management unit, and a data read/write unit. The first interface unit is coupled to the microprocessor unit and used to couple the flash memory units. The second interface unit is coupled to the microprocessor unit and used to couple the host system. The buffer memory is coupled to the microprocessor unit and used to temporarily store the data. The memory management unit is coupled to the microprocessor unit and groups the memory cell arrays of the flash memories in each of the flash memory units into a plurality of data transfer unit sets (DTUSs). The data read/write unit is coupled to the microprocessor unit and interleavingly transfers the data into the flash memory units in units of the DTUSs.

According to an exemplary embodiment of the present invention, a flash memory storage system is provided, wherein the flash memory storage system includes a connector which is used to connect with a host system, a plurality of flash memory units, and a flash memory controller. Each of the flash memory units has a plurality of flash memories, each of the flash memories has a plurality of memory cell arrays, and each of the memory cell arrays at least has a lower page and an upper page, wherein the write speed of the lower page is faster than that of the upper page. The flash memory controller is coupled to the connector and the flash memory units, and receives data from the host system. The flash memory controller groups the memory cell arrays of the flash memories in each of the flash memory units into a plurality of DTUSs. Besides, the flash memory controller interleavingly transfers the data into the flash memory units in units of the DTUSs.

According to an exemplary embodiment of the present invention, a data transfer method is provided. The data transfer method includes providing a plurality of flash memory units. Each of the flash memory units has a plurality of flash memories, each of the flash memories has a plurality of memory cell arrays, and each of the memory cell arrays at least has a lower page and an upper page, wherein the write speed of the lower page is greater than that of the upper page. The data transfer method also includes receiving data from a host system and grouping the memory cell arrays of the flash memories in each of the flash memory units into a plurality of DTUSs. The data transfer method further includes interleavingly transferring the data into the flash memory units in units of the DTUSs.

According to an exemplary embodiment of the present invention, a data transfer method is provided. The data transfer method includes providing a first flash memory unit and a second flash memory unit. The first flash memory unit and the second flash memory unit respectively have a first flash memory and a second flash memory, the first flash memory and the second flash memory respectively have a plurality of memory cell arrays, and each of the memory cell arrays at least has a lower page and an upper page, wherein the write speed of the lower page is greater than that of the upper page. The data transfer method also includes receiving data from a host system. The data transfer method further includes respectively grouping the memory cell arrays in the first flash memory unit and the second flash memory unit into a plurality of DTUSs, wherein each of the DTUSs of the first flash memory unit includes one of the memory cell arrays in the first flash memory of the first flash memory unit and one of the memory cell arrays in the second flash memory of the first flash memory unit, and each of the DTUSs of the second flash memory unit includes one of the memory cell arrays in the first flash memory of the second flash memory unit and one of the memory cell arrays in the second flash memory of the second flash memory unit. The data transfer method still includes interleavingly transferring the data into the first flash memory unit and the second flash memory unit in units of the DTUSs.

According to an exemplary embodiment of the present invention, a data transfer method is provided. The data transfer method includes providing a first flash memory and a second flash memory. The first flash memory and the second flash memory respectively have a plurality of memory cell arrays, and each of the memory cell arrays at least has a lower page, a middle page, and an upper page, wherein the write speed of the lower page is greater than that of the middle page, and the write speed of the middle page is greater than that of the upper page. The data transfer method also includes receiving data from a host system and grouping the lower pages, middle pages, and upper pages in each of the memory cell arrays into a plurality of first sub DTUSs and a plurality of second sub DTUSs, wherein each of the first sub DTUSs includes the lower page and the middle page of one of the memory cell arrays, and each of the second sub DTUSs includes the upper page of one of the memory cell arrays. The data transfer method further includes transferring a part of the data into the first flash memory and the second flash memory according to the first sub DTUSs and then transferring the other part of the data into the first flash memory and the second flash memory according to the second sub DTUSs.

As described above, in the present invention, data can be stably transferred into flash memories, and accordingly the usage of a buffer memory is reduced and the speed for writing data is increased.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2 is a diagram illustrating the page arrangement according to the first exemplary embodiment of the present invention.

DESCRIPTION OF THE EMBODIMENTS

Figure 1:
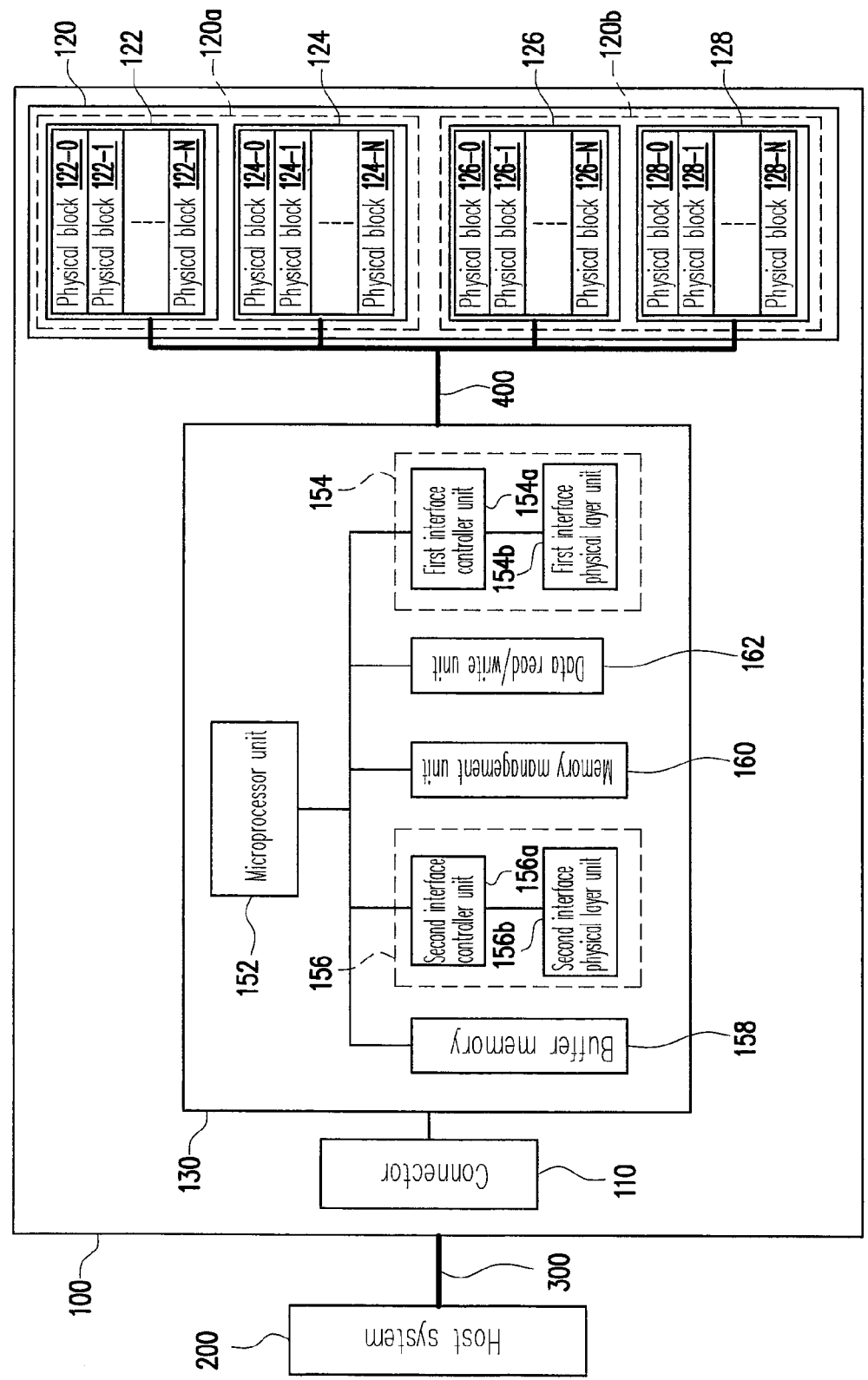
FIG. 1 is a schematic block diagram of a flash memory storage system according to a first exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

FIG. 1 is a schematic block diagram of a flash memory storage system according to a first exemplary embodiment of the present invention.

Referring to FIG. 1, the flash memory storage system 100 usually works together with a host system 200 so that the host system 200 can write data into or read data from the flash memory storage system 100. In the present exemplary embodiment, the flash memory storage system 100 is a solid state drive (SSD). However, in another embodiment of the present invention, the flash memory storage system 100 may also be a memory card or a flash drive.

The flash memory storage system 100 includes a connector 110, a flash memory chip 120, and a flash memory controller (also referred to as a flash memory control circuit) 130.

The connector 110 is coupled to the flash memory controller 130 and is used to connect with the host system 200 through a bus 300. In the present exemplary embodiment, the connector 110 is a Serial Advanced Technology Attachment (SATA) connector. However, the present invention is not limited thereto, and the connector 110 may also be a Universal Serial Bus (USB) connector, an Institute of Electrical and Electronics Engineers (IEEE) 1394 connector, a Peripheral Component Interconnect (PCI) express connector, an Memory Stick (MS) connector, an Multi Media Card (MMC) connector, an Secure Digital (SD) connector, a Compact Flash (CF) connector, an Integrated Drive Electronics (IDE) connector or other suitable connectors.

The flash memory chip 120 is coupled to the flash memory controller 130 and is used to store data under the control of the flash memory controller 130. The flash memory chip 120 has a first multi level cell (MLC) NAND flash memory 122, a second MLC NAND flash memory 124, a third MLC NAND flash memory 126, and a fourth MLC NAND flash memory 128, wherein the first MLC NAND flash memory 122, the second MLC NAND flash memory 124, the third MLC NAND flash memory 126, and the fourth MLC NAND flash memory 128 respectively have a plurality of physical blocks.

In the present exemplary embodiment, a physical block (for example, the physical block 122-0) is the smallest unit for erasing data. Namely, each physical block has the least number of memory cells which are erased together. In addition, each physical block is divided into a plurality of pages. For example, each physical block has 192 pages. In the present exemplary embodiment, a page is the smallest unit for programming (i.e., writing) data. In the present exemplary embodiment, each page has 2048 bytes.

It should be mentioned that in the present exemplary embodiment, the first MLC NAND flash memory 122, the second MLC NAND flash memory 124, the third MLC NAND flash memory 126, and the fourth MLC NAND flash memory 128 are 3-level cell NAND flash memories. Namely, each memory cell in the first MLC NAND flash memory 122, the second MLC NAND flash memory 124, the third MLC NAND flash memory 126, and the fourth MLC NAND flash memory 128 can be programmed in three phases, and accordingly the number of bits which each memory cell is capable of storing is 3. Thus, in the present exemplary embodiment, every 16384 memory cells provide a storage space of 3 pages. In addition, as described above, because data is written into a MLC NAND flash memory in multiple phases and different phases have different write speeds, in the present exemplary embodiment, the 3 pages provided by every 16384 memory cells are distinguished as a lower page, a middle page, and an upper page according to the write speeds thereof, and the 16384 memory cells for providing the lower page, middle page, and upper page are considered as a memory cell array.

FIG. 2 is a diagram illustrating the page arrangement according to the first exemplary embodiment of the present invention. It should be understood that each physical block in the first MLC NAND flash memory 122, the second MLC NAND flash memory 124, the third MLC NAND flash memory 126, and the fourth MLC NAND flash memory 128 has the same page configuration, and accordingly the structure illustrated in FIG. 2 is adaptable to all the physical blocks in the present exemplary embodiment.

Referring to FIG. 2, the memory cells for storing pages in each row (for example, page 0, page 1, and page 2) are considered as one memory cell array, wherein the speed for programming the lower page (for example, the page 0) is faster than that for programming the middle page (for example, the page 1), and the speed for programming the middle page is faster than that for programming the upper page (for example, the page 2). For example, the speed for programming the lower page may be about 0.3 milliseconds, the speed for programming the middle page may be about 1.5 milliseconds, and the speed for programming the upper page may be about 4 milliseconds. In particular, according to the physical characteristic of flash memories, page data has to be written into the pages according to the arrangement sequence of these pages.

In addition, as described above, while programming the flash memories (i.e., the first MLC NAND flash memory 122, the second MLC NAND flash memory 124, the third MLC NAND flash memory 126, and the fourth MLC NAND flash memory 128), the data has to be transferred into buffer areas (not shown) of the flash memories first. In the present exemplary embodiment, the data transferring time is about 0.4 milliseconds.

In another exemplary embodiment of the present invention, the physical blocks in the flash memory chip 120 may also be grouped into several zones. By managing the physical blocks in units of zones, the parallelism of operations is increased and the management of these physical blocks is simplified.

Referring to FIG. 1 again, the flash memory controller 130 executes a plurality of logic gates or machine instructions implemented as a hardware form or a firmware form, so as to coordinate with the connector 110 and the flash memory chip 120 to carry out various operations. Particularly, in the present exemplary embodiment, the flash memory controller 130 transfers page data to the first MLC NAND flash memory 122, the second MLC NAND flash memory 124, the third MLC NAND flash memory 126, and the fourth MLC NAND flash memory 128 through an I/O data bus 400. Thus, in the present exemplary embodiment, the flash memory controller 130 transfers the page data to the first MLC NAND flash memory 122, the second MLC NAND flash memory 124, the third MLC NAND flash memory 126, and the fourth MLC NAND flash memory 128 in an interleaving manner, so as to write the page data into the first MLC NAND flash memory 122, the second MLC NAND flash memory 124, the third MLC NAND flash memory 126, and the fourth MLC NAND flash memory 128.

The flash memory controller 130 includes a microprocessor unit 152, a first interface unit 154, a second interface unit 156, a buffer memory 158, a memory management unit 160, and a data read/write unit 162.

The microprocessor unit 152 controls the operation of the entire flash memory controller 130. Namely, the operations of the components in the flash memory controller 130 are directly or indirectly controlled by the microprocessor unit 152.

The first interface unit 154 is coupled to the microprocessor unit 152 and includes a first interface controller unit 154a and a first interface physical layer unit 154b coupled to the first interface controller unit 154a. The first interface physical layer unit 154b is used to couple to the flash memory chip 120, and the first interface controller unit 154a processes the data transferred to the flash memory chip 120 or identifies the data received from the flash memory chip 120. Namely, the data to be written into the flash memory chip 120 is converted by the first interface unit 154 into a format acceptable to the flash memory chip 120.

The second interface unit 156 is coupled to the microprocessor unit 152 and includes a second interface controller unit 156a and a second interface physical layer unit 156b coupled to the second interface controller unit 156a. The second interface physical layer unit 156b is coupled to the connector 110 and used to connect with the host system 200, and the second interface controller unit 156a processes the data transferred to or received from the host system 200. Namely, the commands or data transferred by the host system 200 are transferred to the microprocessor unit 152 through the second interface unit 156. In the present exemplary embodiment, the second interface unit 156 conforms to the SATA interface standard in correspondence with the connector 110. However, the present invention is not limited thereto, and the second interface unit 156 may also be implemented according to the USB interface standard, the IEEE 1394 interface standard, the PCI express interface standard, the MS interface standard, the MMC interface standard, the SD interface standard, the CF interface standard, the IDE interface standard, or other suitable data transmission interface standard in correspondence with the connector 110.

The buffer memory 158 is coupled to the microprocessor unit 152 and used to temporarily store data to be written into or read from the flash memory chip 120 by the host system 200. The buffer memory 158 is a static random access memory (SRAM). However, the present invention is not limited thereto, and a dynamic random access memory (DRAM), a magnetoresistive random access memory (MRAM), a phase change random access memory (PCRAM), a single level cell (SLC) NAND flash memory, or other suitable memories may also be applied to the present invention.

The memory management unit 160 is coupled to the microprocessor unit 152 and used to operate and manage the flash memory chip 120. For example, the memory management unit 160 maintains a logical address-physical address mapping table for the flash memory chip 120 and converts a logical address (for example, a logical block) accessed by the host system 200 into a physical address (for example, a physical block) according to the logical address-physical address mapping table so that the data read/write unit 162 can write or read data accordingly.

It should be mentioned that in the present exemplary embodiment, the memory management unit 160 groups the first MLC NAND flash memory 122 and the second MLC NAND flash memory 124 as a first flash memory unit 120a and the third MLC NAND flash memory 126 and the fourth MLC NAND flash memory 128 as a second flash memory unit 120b.

Besides, the memory management unit 160 groups the memory cell arrays of the flash memories in each of the flash memory units into a plurality of data transfer unit sets (DTUSs). For example, the memory management unit 160 groups the $0^{th}$ memory cell array in the physical block 122-0 (i.e., the pages 0, 1, and 2 in the physical block 122-0) of the first flash memory 122 and the $0^{th}$ memory cell array in the physical block 124-0 (i.e., the pages 0, 1, and 2 in the physical block 124-0) of the second flash memory 124 into a DTUS. In addition, the memory management unit 160 transmits the grouping information of the DTUSs to the data read/write unit 162.

The data read/write unit 162 is coupled to the microprocessor unit 152, and transfers data to be written by the host system 200 to the flash memory chip 120 or reads data to be read by the host system 200 from the flash memory chip 120 through the first interface unit 154.

It should be mentioned that when the host system 200 is about to write a plurality of continuous page data into the flash memory storage system 100, the data read/write unit 162 interleavingly transfers the page data to be written by the host system 200 to the first flash memory unit 120a and the second flash memory unit 120b in units of the DTUSs according to the grouping information received from the memory management unit 160.

Figure 3:
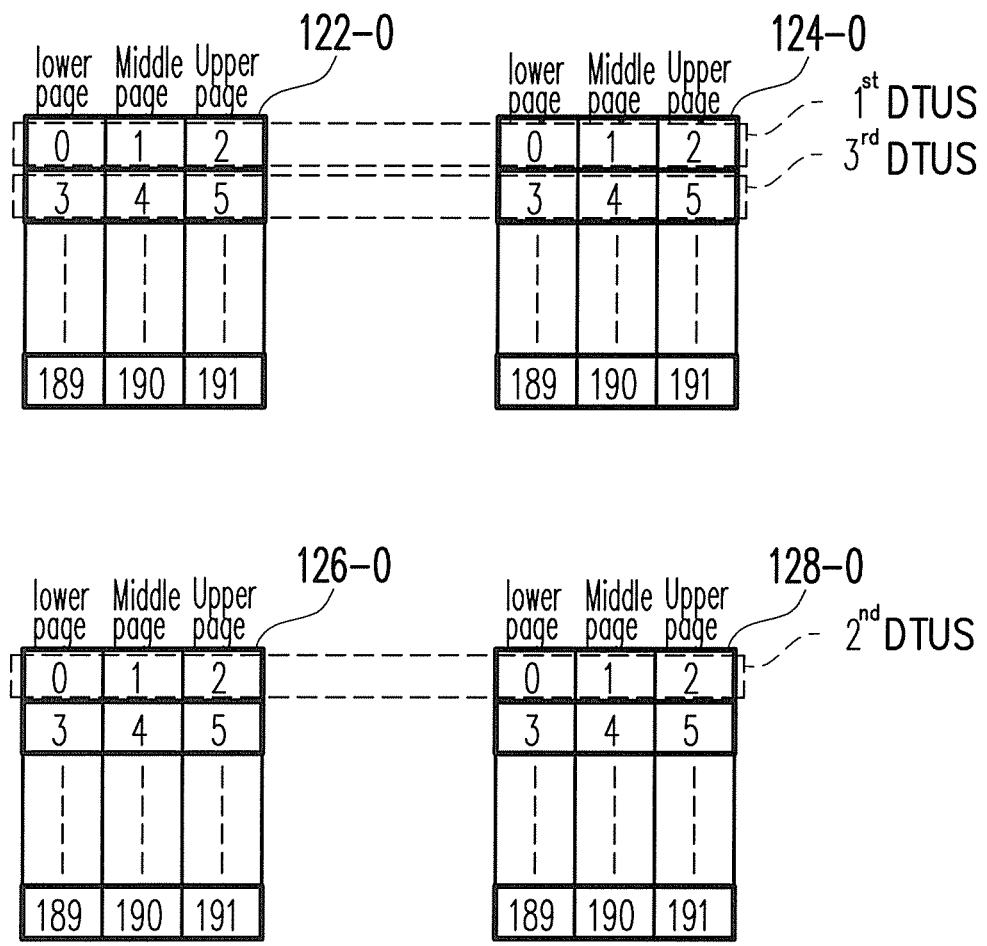
FIG. 3 illustrates how memory cell arrays are grouped according to the first exemplary embodiment of the present invention.
Figure 4:
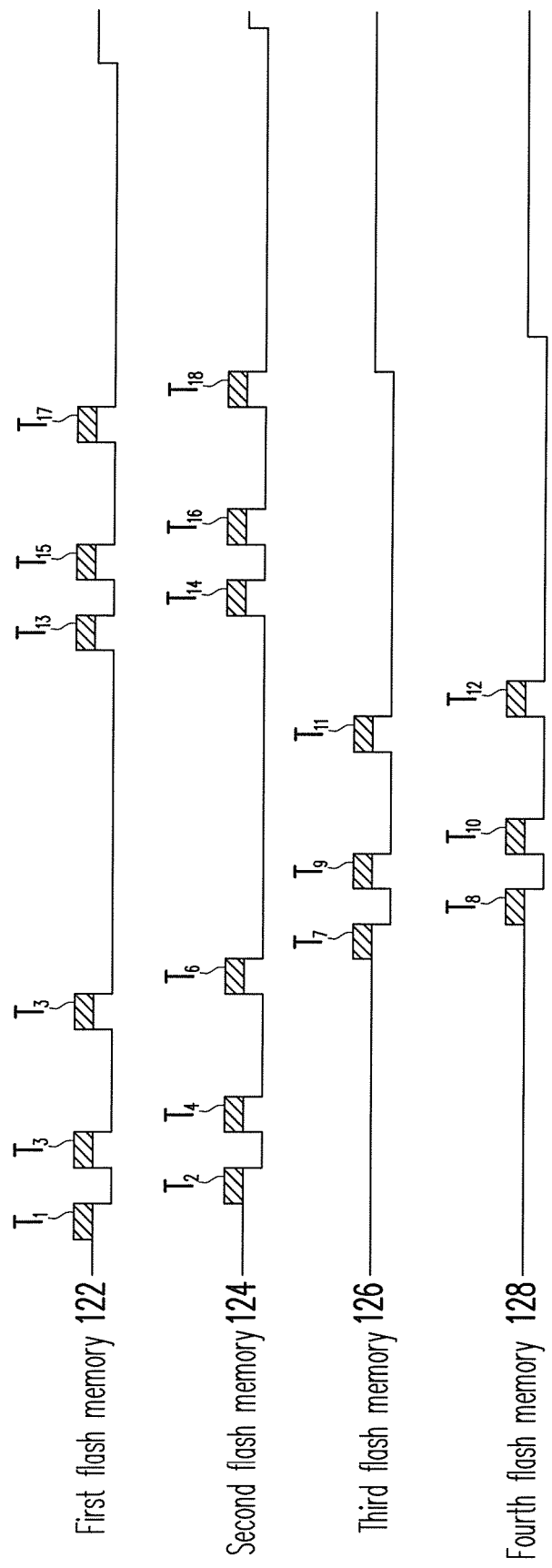
FIG. 4 illustrates an example of how page data is interleavingly transferred and programmed according to the first exemplary embodiment of the present invention.

FIG. 3 illustrates how memory cell arrays are grouped according to the first exemplary embodiment of the present invention, and FIG. 4 illustrates an example of how page data is interleavingly transferred and programmed according to the first exemplary embodiment of the present invention.

In the examples illustrated in FIG. 3 and FIG. 4, it is assumed that the host system 200 is about to write page data PD1~PD18 into the flash memory storage system 100, and the memory management unit 160 writes the page data PD1~PD18 by using the physical block 122-0 of the first flash memory 122, the physical block 124-0 of the second flash memory 124, the physical block 126-0 of the third flash memory 126, and the physical block 128-0 of the fourth flash memory 128, so as to increase the speed for writing the page data.

Referring to FIG. 3, as described above, each memory cell array provides a storage capacity of 3 pages. Thus, the memory management unit 160 requires 6 memory cell arrays for storing the page data PD1~PD18. Besides, since data has to be written into a physical block according to the sequence of the pages, the memory management unit 160 stores the page data PD1~PD18 by using the $0^{th}$ memory cell array of the physical block 122-0 (i.e., the pages 0, 1, and 2 of the physical block 122-0), the $0^{th}$ memory cell array of the physical block 124-0 (i.e., the pages 0, 1, and 2 of the physical block 124-0), the $0^{th}$ memory cell array of the physical block 126-0 (i.e., the pages 0, 1, and 2 of the physical block 126-0), the $0^{th}$ memory cell array of the physical block 128-0 (i.e., the pages 0, 1, and 2 of the physical block 128-0), the $1^{st}$ memory cell array of the physical block 122-0 (i.e., the pages 3, 4, and 5 of the physical block 122-0), and the $1^{st}$ memory cell array of the physical block 124-0 (i.e., the pages 3, 4, and 5 of the physical block 124-0) in sequence.

Particularly, in the present exemplary embodiment, the memory management unit 160 groups the $0^{th}$ memory cell array of the physical block 122-0 and the $0^{th}$ memory cell array of the physical block 124-0 into a first DTUS of the current data writing process, the $0^{th}$ memory cell array of the physical block 126-0 and the $0^{th}$ memory cell array of the physical block 128-0 into a second DTUS of the current data writing process, and the $1^{st}$ memory cell array of the physical block 122-0 and the $1^{st}$ memory cell array of the physical block 124-0 into a third DTUS of the current data writing process.

When the data read/write unit 162 receives the grouping information (i.e., the $1^{st}$ DTUS, the $2^{nd}$ DTUS, and the $3^{rd}$ DTUS) of the current data writing process from the memory management unit 160, the data read/write unit 162 interleavingly transfers the page data to be written into each of the DTUSs to the corresponding flash memory units. Referring to FIG. 4, the data read/write unit 162 first transfers the page data to be written into the $1^{st}$ DTUS to the first flash memory unit 120a (i.e., the first flash memory 122 and the second flash memory 124), and then transfers the page data to be written into the $2^{nd}$ DTUS to the second flash memory unit 120b (i.e., the third flash memory 126 and the fourth flash memory 128), and finally, transfers the page data to be written into the $3^{rd}$ DTUS to the first flash memory unit 120a.

To be specific, the data read/write unit 162 first transfers the page data to be written into the pages 0, 1, and 2 of the physical block 122-0 and the pages 0, 1, and 2 of the physical block 124-0 to the first flash memory 122 and the second flash memory 124 (i.e., the transfers T1, T2, T3, T4, T5, and T6). After that, the data read/write unit 162 transfers the page data to be written into the pages 0, 1, and 2 of the physical block 126-0 and the pages 0, 1, and 2 of the physical block 128-0 to the third flash memory 126 and the fourth flash memory 128 (i.e., the transfers T7, T8, T9, T10, T11, and T12). Finally, the data read/write unit 162 transfers the page data to be written into the pages 3, 4, and 5 of the physical block 122-0 and the pages 3, 4, and 5 of the physical block 124-0 to the first flash memory 122 and the second flash memory 124 (i.e., the transfers T13, T14, T15, T16, T17, and T18).

Additionally, in the present exemplary embodiment, the data read/write unit 162 transfers the data to the flash memories of each flash memory unit in an interleaving manner. As shown in FIG. 4, during transferring the page data to be written into the pages 0, 1, and 2 of the physical block 122-0 and the pages 0, 1, and 2 of the physical block 124-0 to the first flash memory 122 and the second flash memory 124, the data read/write unit 162 sequentially transfers the page data to be written into the page 0 of the physical block 122-0 to the first flash memory 122 (i.e., the transfer T1), transfers the page data to be written into the page 0 of the physical block 124-0 to the second flash memory 124 (i.e., the transfer T2), transfers the page data to be written into the page 1 of the physical block 122-0 to the first flash memory 122 (i.e., the transfer T3), transfers the page data to be written into the page 1 of the physical block 124-0 to the second flash memory 124 (i.e., the transfer T4), transfers the page data to be written into the page 2 of the physical block 122-0 to the first flash memory 122 (i.e., the transfer T5), and transfers the page data to be written into the page 2 of the physical block 124-0 to the second flash memory 124 (i.e., the transfer T6). The transfers T7~T12 and the transfers T13~T18 are also executed in the interleaving manner and which will not be described herein.

As shown in FIG. 4, the transfers T1~T18 can be executed stably and will not be interrupted for a long time due to all the flash memories are in the busy status. For example, the $1^{st}$ page data is first transferred into the first flash memory; after the $1^{st}$ page data is written into the $0^{th}$ page of the first flash memory, the $2^{nd}$ page data is transferred into the first flash memory; after the $2^{nd}$ page data is written into the $1^{st}$ page of the first flash memory, the $3^{rd}$ page data is transferred into the first flash memory; while the $3^{rd}$ page data is written into the $2^{nd}$ page of the first flash memory, the $4^{th}$ page data is transferred into the second flash memory; after the $4^{th}$ page data is written into the $0^{th}$ page of the second flash memory, the $5^{th}$ page data is transferred into the second flash memory; and after the $5^{th}$ page data is written into the $1^{st}$ page of the second flash memory, the $6^{th}$ page data is transferred into the second flash memory and the $6^{th}$ page data is written into the $2^{nd}$ page of the second flash memory. Thus, the flash memory storage system 100 in the present exemplary embodiment allows the data to be written by the host system 200 to be stably transferred to the flash memory chip 120, so that the usage of the buffer memory 158 can be effectively reduced.

It should be mentioned that as described above, even though the memory management unit 160 and the data read/write unit 162 are implemented in the flash memory controller 130 as a hardware form, the present invention is not limited thereto. In another exemplary embodiment, the memory management unit 160 and the data read/write unit 162 may also be implemented in the flash memory controller 130 as a firmware form. For example, a plurality of programs for accomplishing the functions of the memory management unit 160 and the data read/write unit 162 are burned into a program memory (for example, a read only memory (ROM)), and the program memory is embedded into the flash memory controller 130. When the flash memory storage system 100 is in operation, these programs are executed by the microprocessor unit 152 to accomplish the data transfer mechanism implemented according to exemplary embodiments of the present invention.

In yet another embodiment of the present invention, a plurality of programs for accomplishing the functions of the memory management unit 160 and the data read/write unit 162 may also be stored in a specific area of the flash memory chip 120 (for example, the system area in a flash memory for storing system data) as a program code form. Similarly, these programs are executed by the microprocessor unit 152 when the flash memory storage system 100 is in operation.

Figure 5:
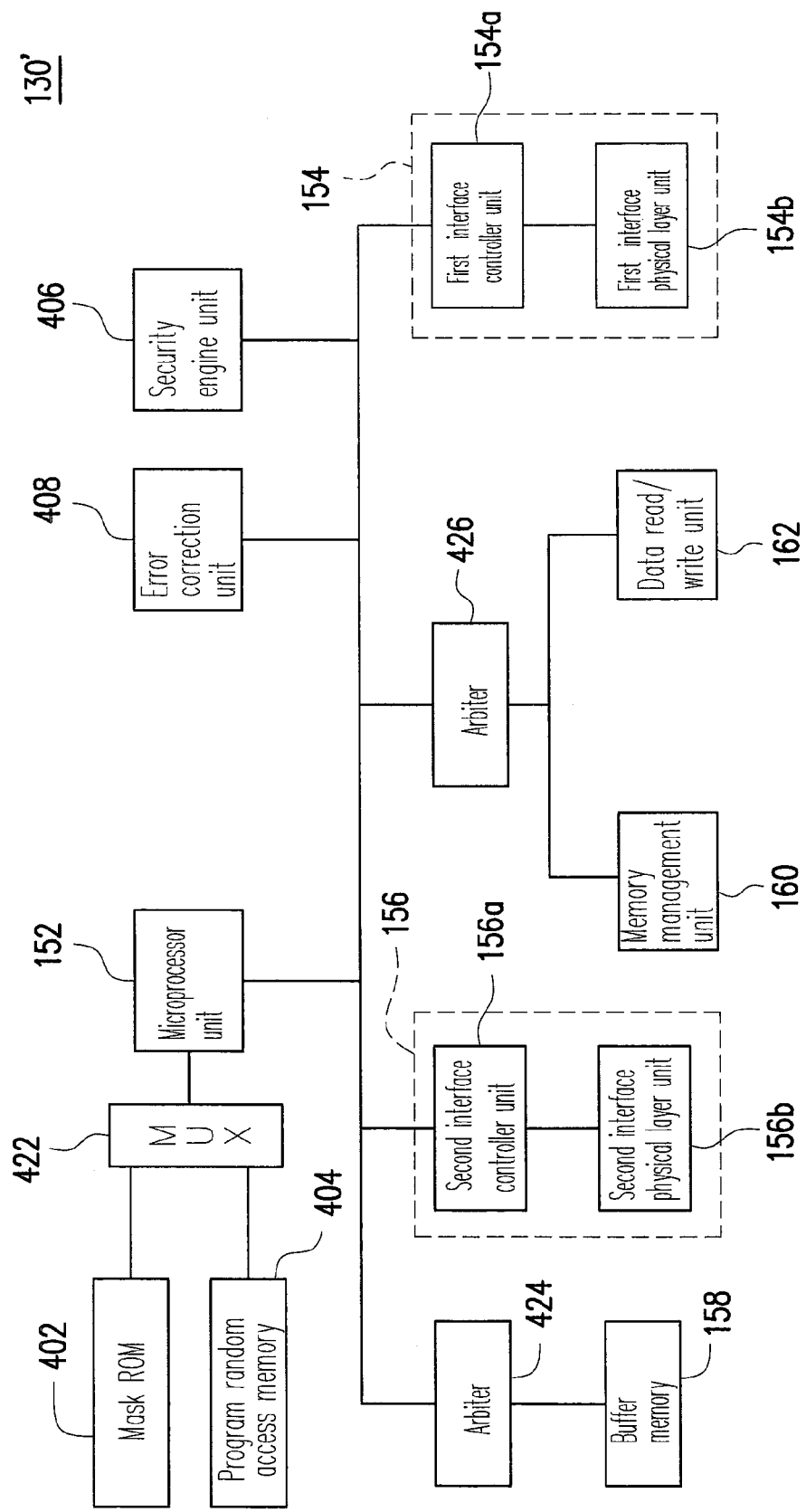
FIG. 5 is a block diagram of a flash memory controller according to another exemplary embodiment of the present invention.

In still another exemplary embodiment of the present invention, the flash memory controller may also include other circuit units. FIG. 5 is a block diagram of a flash memory controller according to another exemplary embodiment of the present invention. Referring to FIG. 5, besides foregoing microprocessor unit 152, first interface unit 154, second interface unit 156, buffer memory 158, memory management unit 160, and data read/write unit 162, the flash memory controller 130' further includes a mask ROM 402, a program random access memory 404, and a security engine unit 406. Moreover, the flash memory controller 130' is further configured with arbiters 424 and 426 to couple the buffer memory 158, the memory management unit 160, and the data read/write unit 162 to the microprocessor unit 152.

The mask ROM 402 and the program random access memory 404 are coupled to the microprocessor unit 152 through a multiplexer (MUX) 422. The mask ROM 402 stores information or program codes for the flash memory controller 130', particularly the information or program codes cannot be updated. The program random access memory 404 temporarily stores the firmware code being executed by the microprocessor unit 152. To be specific, because random access memory has very fast operation speed, the operation efficiency of the flash memory controller 130' can be increased by loading the firmware codes executed by the microprocessor unit 152 into the program random access memory in advance. For example, in foregoing example wherein the memory management unit 160 and the data read/write unit 162 are implemented as a program code form or a firmware form, when the flash memory storage system 100 is initialized, the programs for accomplishing the functions of the memory management unit 160 and the data read/write unit 162 are loaded into the program random access memory in advance and then executed by the microprocessor unit 152.

The security engine unit 406 is coupled to the microprocessor unit 152 and used to encrypt/decrypt the data to be written into the flash memory chip 120, so as to ensure the safety of the data. In the present exemplary embodiment, the encryption/decryption technique adopted by the security engine unit 406 is the advanced encryption standard (AES). However, the present invention is not limited thereto, and the data encryption standard (DES) or other encryption techniques may also be applied to the present invention.

The error correction unit 408 is coupled to the microprocessor unit 152. The error correction unit 408 generates an error correcting code (ECC) according to the data to be written by the host system 200 into the flash memory chip 120 and executes an error correcting procedure when the host system 200 is about to read the data from the flash memory chip 120 according to the generated ECC, so as to ensure the correctness of the data.

Figure 6:
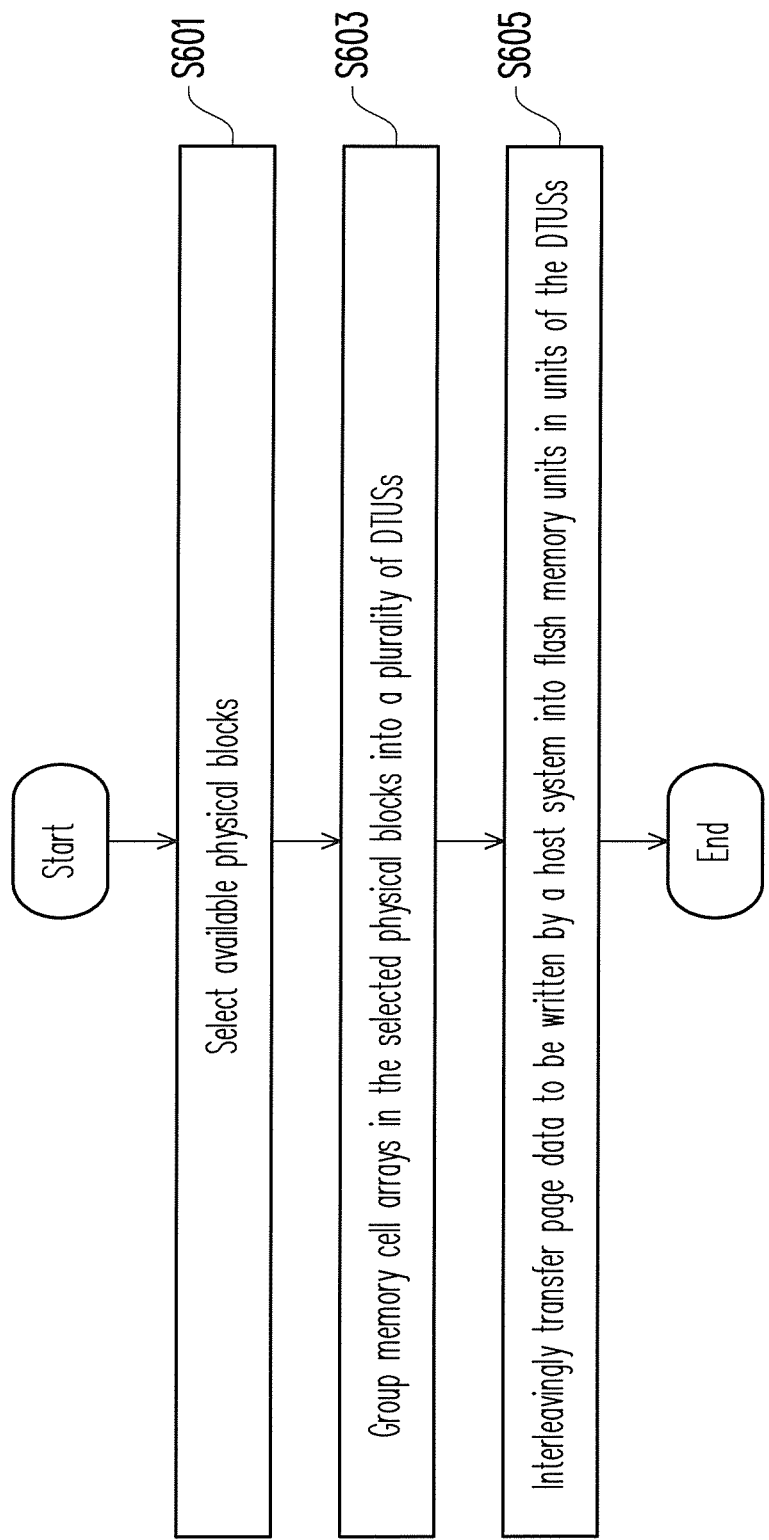
FIG. 6 is a flowchart of a data transferring process according to the first exemplary embodiment of the present invention.

FIG. 6 is a flowchart of a data transferring process according to the first exemplary embodiment of the present invention.

Referring to FIG. 6, when the host system 200 is about to write a great quantity of page data into the flash memory storage system 100, in step S601, the memory management unit 160 selects available physical blocks from the first flash memory 122, the second flash memory 124, the third flash memory 126, and the fourth flash memory 128 according to the logical address-physical address mapping table and the disposition information of the related flash memories.

Then, in step S603, the memory management unit 160 groups the memory cell arrays in the selected physical blocks into a plurality of DTUSs. The method for grouping the memory cell arrays into the DTUSs has been described above with reference to FIG. 3 therefore will not be described herein.

Next, in step S605, the data read/write unit 162 interleavingly transfers the page data to be written by the host system 200 to the flash memory units 120a and 120b in units of the DTUSs according to the grouping information generated by the memory management unit 160.

It should be mentioned that in the examples illustrated in FIG. 3 and FIG. 4, the data to be written by the host system 200 is transferred and programmed by using the first flash memory 122, the second flash memory 124, the third flash memory 126, and the fourth flash memory 128 in an interleaving manner. However, the present invention is not limited thereto. For example, when the host system 200 is about to write only a small quantity of data, the memory management unit 160 and the data read/write unit 162 can interleavingly use only two flash memories to transfer and program the data. Or, when the flash memory storage system is configured with more flash memories, the memory management unit 160 and the data read/write unit 162 may also interleavingly use more flash memories to transfer and program the data to be written by the host system 200.

Figure 7:
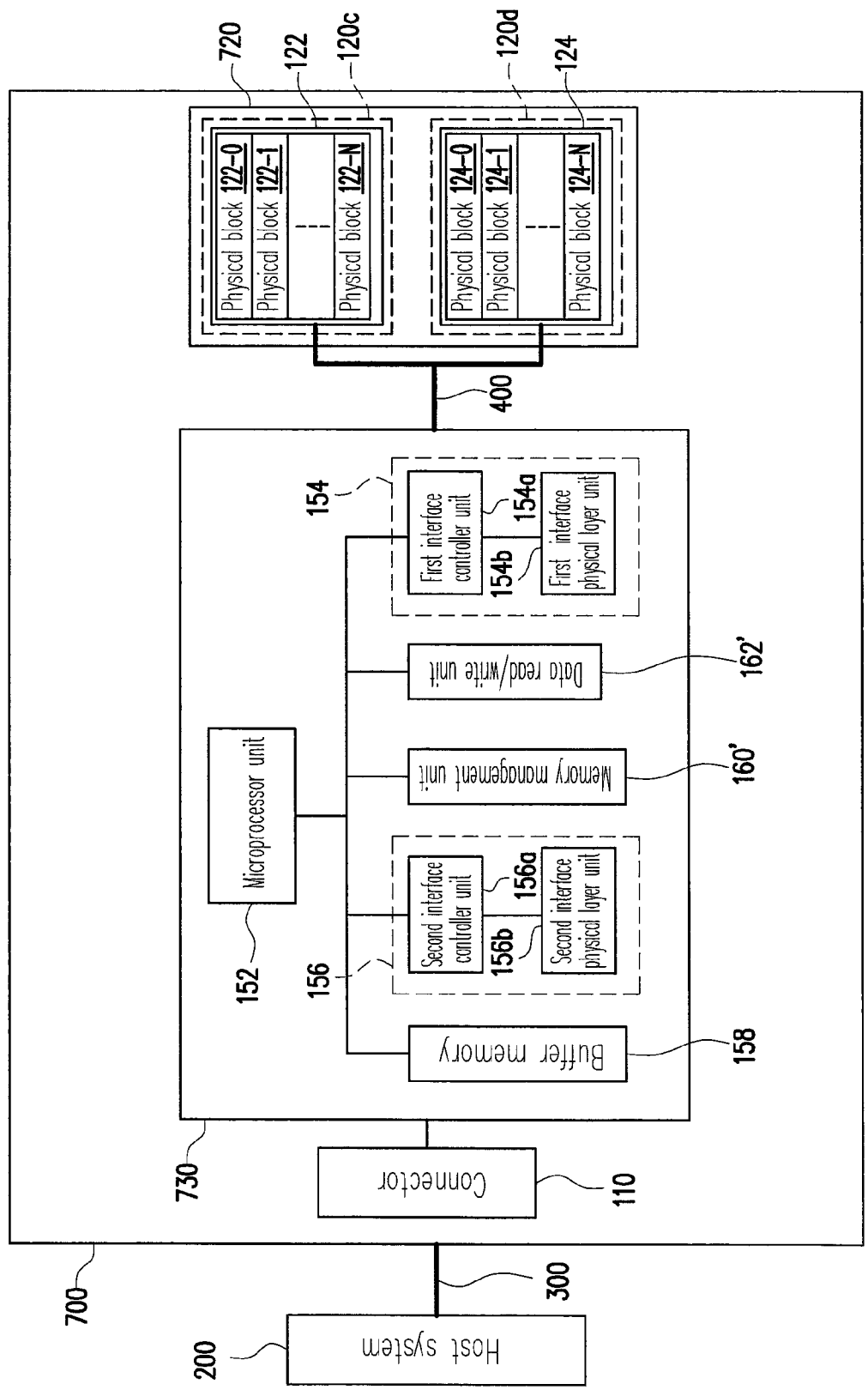
FIG. 7 is a schematic block diagram of a flash memory storage system according to a second exemplary embodiment of the present invention.

FIG. 7 is a schematic block diagram of a flash memory storage system according to a second exemplary embodiment of the present invention.

Referring to FIG. 7, the flash memory storage system 700 includes a connector 110, a flash memory chip 720, and a flash memory controller 730. The difference between the flash memory storage system 700 and the flash memory storage system 100 is that the flash memory chip 720 of the flash memory storage system 700 includes only two flash memories. Thus, the memory management unit 160' and the data read/write unit 162' of the flash memory controller 730 only group and transfer data regarding the two flash memories. Other than that, the flash memory storage system 700 has substantially the same structure and function as the flash memory storage system 100 therefore will not be described herein.

In the flash memory storage system 700, the flash memory chip 720 includes a first flash memory 122 and a second flash memory 124. Thus, the memory management unit 160' groups the first flash memory 122 into a first flash memory unit 120c and the second flash memory 124 into a second flash memory unit 120d. Namely, each flash memory unit in the flash memory storage system 700 includes only one flash memory.

Figure 8:
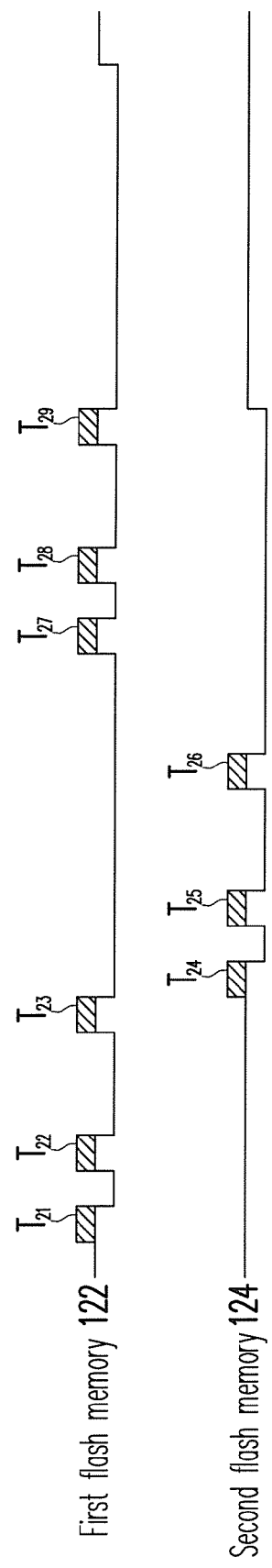
FIG. 8 illustrates an example of how page data is interleavingly transferred and programmed according to the second exemplary embodiment of the present invention.

FIG. 8 illustrates an example of how page data is interleavingly transferred and programmed according to the second exemplary embodiment of the present invention. In the present example, it is assumed that the host system 200 is about to write page data PD1~PD9 into the flash memory storage system 700, and the memory management unit 160' writes the page data PD1~PD9 by using the $0^{th}$ memory cell array and the $1^{st}$ memory cell array in the physical block 122-1 of the first flash memory 122 and the $0^{th}$ memory cell array in the physical block 124-1 of the second flash memory 124.

Similar to that illustrated in FIG. 3, the memory management unit 160' groups the $0^{th}$ memory cell array (i.e., the pages 0, 1, and 2) and the $1^{st}$ memory cell array (i.e., the pages 3, 4, and 5) of the physical block 122-1 and the $0^{th}$ memory cell array (i.e., the pages 0, 1, and 2) of the physical block 124-1. To be specific, in the present example, the pages 0, 1, and 2 of the physical block 122-1 are grouped into a $1^{st}$ DTUS of the current writing process, the pages 0, 1, and 2 of the physical block 124-1 are grouped into a $2^{nd}$ DTUS of the current writing process, and the pages 3, 4, and 5 of the physical block 122-1 are grouped into a $3^{rd}$ DTUS of the current writing process.

After that, the data read/write unit 162' interleavingly transfers the page data PD1~PD9 into the first flash memory unit 120c and the second flash memory unit 120d in units of the DTUSs according to the grouping information generated by the memory management unit 160'.

Referring to FIG. 8, the data read/write unit 162' first transfers the page data to be written into the pages 0, 1, and 2 of the physical block 122-1 to the first flash memory 122 (i.e., the transfers T21, T22, and T23). Then, the data read/write unit 162' transfers the page data to be written into the pages 0, 1, and 2 of the physical block 124-1 to the second flash memory 124 (i.e., the transfers T24, T25, and T26). Finally, the data read/write unit 162' transfers the page data to be written into the pages 3, 4, and 5 of the physical block 122-1 to the first flash memory 122 (i.e., the transfers T27, T28, and T29). That is, the $1^{st}$ page data is first transferred into the first flash memory; after the $1^{st}$ page data is programmed into the $0^{th}$ page of the first flash memory, the $2^{nd}$ page data is transferred into the first flash memory; after the $2^{nd}$ page data is programmed into the $1^{st}$ page of the first flash memory, the $3^{rd}$ page data is transferred into the first flash memory; while the $3^{rd}$ page data is programmed into the $2^{nd}$ page of the first flash memory, the $4^{th}$ page data is transferred into the second flash memory; after the $4^{th}$ page data is programmed into the $0^{th}$ page of the second flash memory, the $5^{th}$ page data is transferred into the second flash memory; after the $5^{th}$ page data is programmed into the 1st page of the second flash memory, the 6th page data is transferred into the second flash memory; while the 6th page data is programmed into the 2nd page of the second flash memory, the 7th page data is transferred into the first flash memory; after the 7th page data is programmed into the 3rd page of the first flash memory, the 8th page data is transferred into the first flash memory; after the 8th page data is programmed into the 4th page of the first flash memory, the 9th page data is transferred into the first flash memory.

It should be mentioned that in the second exemplary embodiment, the lower page, middle page, and upper page are grouped into one DTUS in each of the memory cell arrays. However, in another embodiment of the present invention, the flash memory storage system 700 may also group the lower page and the middle page into a first sub DTUS and group the upper page into a second sub DTUS in each of the memory cell arrays, and the data read/write unit 162' may interleavingly transfer data between the first flash memory 122 and the second flash memory 124 in units of the first sub DTUSs and the second sub DTUSs.

Figure 9:
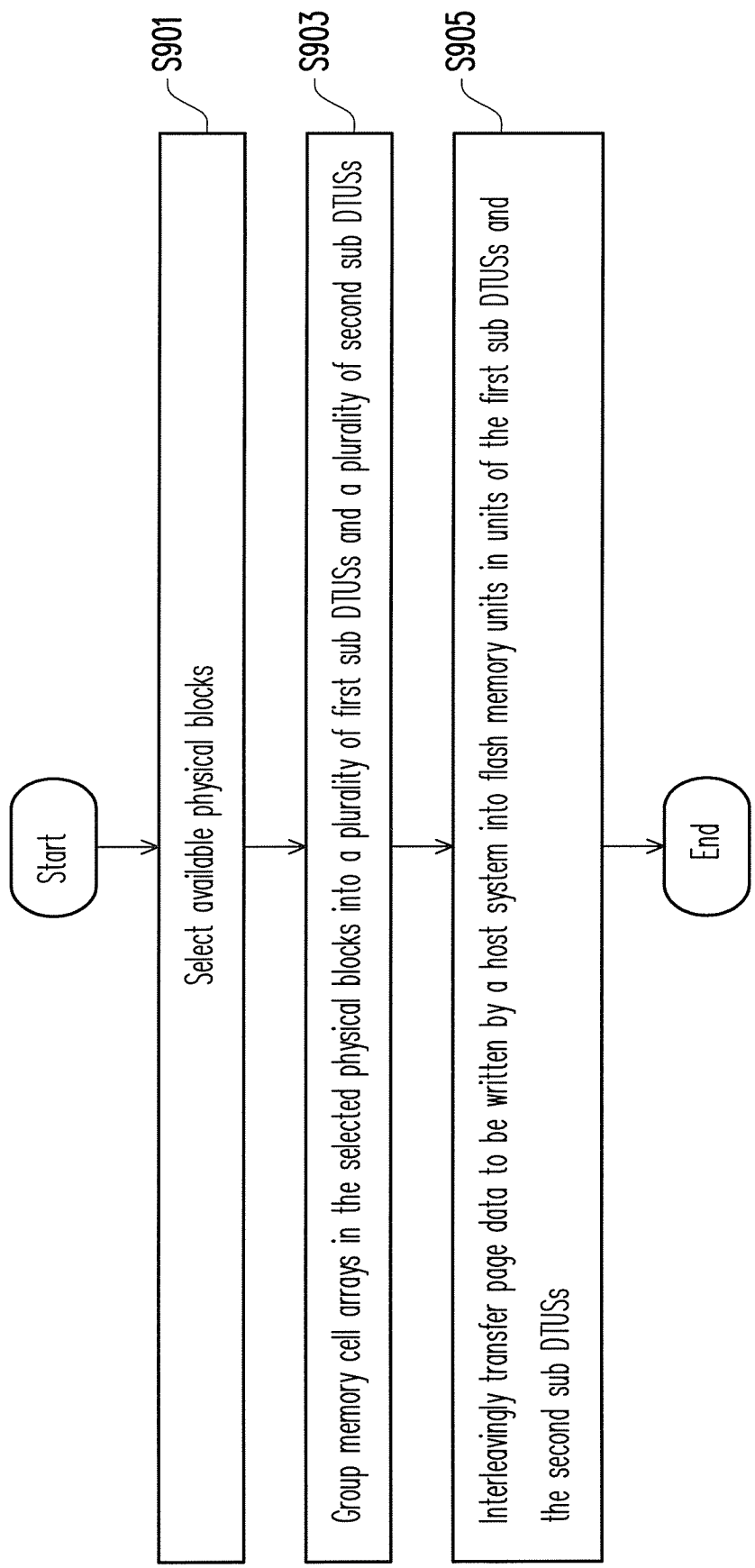
FIG. 9 is a flowchart of a data transferring process according to a third exemplary embodiment of the present invention.
Figure 10:
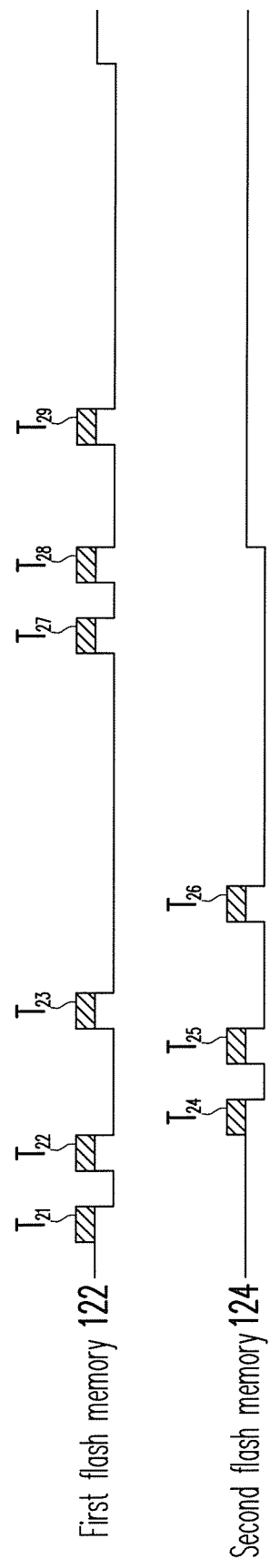
FIG. 10 illustrates an example of how page data is interleavingly transferred and programmed according to the third exemplary embodiment of the present invention.

FIG. 9 is a flowchart of a data transferring process according to a third exemplary embodiment of the present invention, and FIG. 10 illustrates an example of how page data is interleavingly transferred and programmed according to the third exemplary embodiment of the present invention.

Referring to FIG. 9 and FIG. 10, when the host system 200 is about to write a great quantity of page data into the flash memory storage system 700, in step S901, the memory management unit 160' selects available physical blocks from the first flash memory 122 and the second flash memory 124 according to the logical address-physical address mapping table and the disposition information of the related flash memories.

Next, in step S903, the memory management unit 160' respectively groups the pages in the memory cell arrays of the selected physical blocks into a plurality of first sub DTUSs and a plurality of second sub DTUSs. To be specific, in each of the memory cell arrays, the lower page and the middle page are considered as a first sub DTUS while the upper page is considered as a second sub DTUS. For example, taking the physical block 122-1 of the first flash memory 122 as an example, the pages 0 and 1, the pages 3 and 4, the pages 6 and 7 are respectively grouped into a first sub DTUS, and the page 2, the page 5, and the page 8 are respectively grouped into a second sub DTUS.

Thereafter, in step S905, the data read/write unit 162' interleavingly transfers the page data to be written by the host system 200 into the first flash memory 122 and the second flash memory 124 in units of the first and the second sub DTUSs according to the grouping information generated by the memory management unit 160'.

For example, the data read/write unit 162' first transfers the page data to be written into the pages 0 and 1 of the physical block 122-1 to the first flash memory 122 (i.e., the transfers T21 and T22). Then, the data read/write unit 162' transfers the page data to be written into the pages 0 and 1 of the physical block 124-1 to the second flash memory 124 (i.e., the transfers T24 and T25). Next, the data read/write unit 162' transfers the page data to be written into the page 2 of the physical block 122-1 to the first flash memory 122 (i.e., the transfer T23). After that, the data read/write unit 162' transfers the page data to be written into the page 2 of the physical block 124-1 to the second flash memory 124 (i.e., the transfer T26). Thereafter, the data read/write unit 162' transfers the page data to be written into the pages 3 and 4 of the physical block 122-1 to the first flash memory 122 (i.e., the transfers T27 and T28). Finally, the data read/write unit 162' transfers the page data to be written into the page 5 of the physical block 122-1 to the first flash memory 122 (i.e., the transfer T29). To be specific, the 1st page data is transferred into the first flash memory; after the 1st page data is programmed into the 0th page of the first flash memory, the 2nd page data is transferred into the first flash memory; while the 2nd page data is programmed into the 1st page of the first flash memory, the 4th page data is transferred into the second flash memory; after the 4th page data is programmed into the 0th page of the second flash memory, the 5th page data is transferred into the second flash memory; while the 5th page data is programmed into the 1st page of the second flash memory, the 3rd page data is transferred into the first flash memory; and while the 3rd page data is programmed into the 2nd page of the first flash memory, the 6th page data is transferred into the second flash memory, and the 6th page data is programmed into the 2nd page of the second flash memory.

As described above, in the data transfer method provided by the present invention, data to be written into a plurality of flash memories is grouped into a plurality of DTUSs according to pages of different write speeds, and the data is transferred in units of the DTUSs, so that the transfer won't be interrupted for a long time even when all the flash memories are busy. Thereby, the previously described exemplary embodiments of the present invention have many advantages, including that data to be written by a host system can be transferred to a flash memory chip stably, and the usage of a buffer memory can be effectively reduced, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory control circuit, for transferring data from a host system to a flash memory chip having a first flash memory and a second flash memory, wherein the first flash memory and the second flash memory respectively have a plurality of memory cell arrays, and each of the memory cell arrays at least has a lower page, a middle page and an upper page, wherein write speeds of the lower pages are greater than write speeds of the middle pages and the write speeds of the middle page are greater than write speeds of the upper pages, the flash memory control circuit comprising:
   a microprocessor unit;
   a first interface unit, coupled to the microprocessor unit, and configured to couple to the first flash memory and the second flash memory;
   a second interface unit, coupled to the microprocessor unit, and configured to couple to the host system;
   a buffer memory, coupled to the microprocessor unit, and configured to temporarily store the data, wherein the data has a $1^{st}$ page data, a $2^{nd}$ page data, a $3^{rd}$ page data, a $4^{th}$ page data, a $5^{th}$ page data, and a $6^{th}$ page data,
   wherein the microprocessor unit executes a plurality of instructions to:
   group a $0^{th}$ page, a $1^{st}$ page and a $2^{nd}$ page of the first flash memory into a first data transfer unit set and group a $0^{th}$ page, a $1^{st}$ page and a $2^{nd}$ page of the second flash memory into a second data transfer unit set, wherein the $0^{th}$ pages of the first flash memory and the second flash memory are the lower pages, the $1^{st}$ pages of the first flash memory and the second flash memory are the middle pages, the $2^{nd}$ pages of the first flash memory and the second flash memory are the upper pages, the $0^{th}$ page, the $1^{st}$ page and the $2^{nd}$ page of the first flash memory share a common memory cell, and the $0^{th}$ page, the $1^{st}$ page and the 2nd page of the second flash memory share a common memory cell;

transfer the $1^{st}$ page data into the first flash memory through the first interface unit;

immediately after the $1^{st}$ page data is programmed into the $0^{th}$ page of the first flash memory, transfer the $2^{nd}$ page data into the first flash memory through the first interface unit;

immediately after the 2nd page data is programmed into the $1^{st}$ page of the first flash memory, transfer the $3^{rd}$ page data into the first flash memory through the first interface unit;

while the $3^{rd}$ page data is programmed into the $2^{nd}$ page of the first flash memory, transfer the $4^{th}$ page data into the second flash memory through the first interface unit;

immediately after the $4^{th}$ page data is programmed into the $0^{th}$ page of the second flash memory, transfer the $5^{th}$ page data into the second flash memory through the first interface unit; and immediately after the $5^{th}$ page data is programmed into the $1^{st}$ page of the second flash memory, transfer the $6^{th}$ page data into the second flash memory through the first interface unit, program the $6^{th}$ page data into the $2^{nd}$ page of the second flash memory.

2. A flash memory storage system, comprising:

a connector, for connecting a host system;

a flash memory chip, having a first flash memory and a second flash memory, wherein the first flash memory and the second flash memory respectively have a plurality of memory cell arrays, and each of the memory cell arrays at least has a lower page, a middle page and an upper page, wherein write speeds of the lower pages are greater than write speeds of the middle pages and the write speeds of the middle page are greater than write speeds of the upper pages; and a flash memory controller, coupled to the connector and the flash memory chip, and configured to receive data from the host system, wherein the data has a $1^{st}$ page data, a $2^{nd}$ page data, a $3^{rd}$ page data, a $4^{th}$ page data, a $5^{th}$ page data, and a $6^{th}$ page data, wherein the flash memory controller groups a $0^{th}$ page, a $1^{st}$ page and a $2^{nd}$ page of the first flash memory into a first data transfer unit set and group a $0^{th}$ page, a $1^{st}$ page and a $2^{nd}$ page of the second flash memory into a second data transfer unit set, wherein the $0^{th}$ pages of the first flash memory and the second flash memory are the lower pages, the $1^{st}$ pages of the first flash memory and the second flash memory are the middle pages and the $2^{nd}$ pages of the first flash memory and the second flash memory are the upper pages, wherein the $0^{th}$ page, the $1^{st}$ page and the $2^{nd}$ page of the first flash memory share a common memory cell, and the $0^{th}$ page, the $1^{st}$ page and the $2^{nd}$ page of the second flash memory share a common memory cell, wherein the flash memory controller transfers the $1^{st}$ page data into the first flash memory, wherein immediately after the $1^{st}$ page data is programmed into the $0^{th}$ page of the first flash memory, the flash memory controller transfers the $2^{nd}$ page data into the first flash memory, wherein immediately after the $2^{nd}$ page data is programmed into the $1^{st}$ page of the first flash memory, the flash memory controller transfers the $3^{rd}$ page data into the first flash memory, wherein while the $3^{rd}$ page data is programmed into the $2^{nd}$ page of the first flash memory, the flash memory controller transfers the $4^{th}$ page data into the second flash memory, wherein immediately after the $4^{th}$ page data is programmed into the $0^{th}$ page of the second flash memory, the flash memory controller transfers the $5^{th}$ page data into the second flash memory, wherein immediately after the $5^{th}$ page data is programmed into the $1^{st}$ page of the second flash memory, the flash memory controller transfers the $6^{th}$ page data into the second flash memory, and the flash memory controller programs the $6^{th}$ page data into the $2^{nd}$ page of the second flash memory.

3. A data transfer method, for transferring data having a $1^{st}$ page data, a $2^{nd}$ page data, a $3^{rd}$ page data, a $4^{th}$ page data, a $5^{th}$ page data, and a $6^{th}$ page data from a host system to a flash memory chip having a first flash memory and a second flash memory, wherein the first flash memory and the second flash memory respectively have a plurality of memory cell arrays, and each of the memory cell arrays at least has a lower page, a middle page and an upper page, wherein write speeds of the lower pages are greater than write speeds of the middle pages and the write speeds of the middle page are greater than write speeds of the upper pages, the data transfer method comprising:

grouping a $0^{th}$ page, a $1^{st}$ page and a $2^{nd}$ page of the first flash memory into a first data transfer unit set and group a $0^{th}$ page, a $1^{st}$ page and a $2^{nd}$ page of the second flash memory into a second data transfer unit set, wherein the $0^{th}$ pages of the first flash memory and the second flash memory are the lower pages, the $1^{st}$ pages of the first flash memory and the second flash memory are the middle pages, the $2^{nd}$ pages of the first flash memory and the second flash memory are the upper pages, the $0^{th}$ page, the $1^{st}$ page and the $2^{nd}$ page of the first flash memory share a common memory cell, and the $0^{th}$ page, the $1^{st}$ page and the $2^{nd}$ page of the second flash memory share a common memory cell;

transferring the $1^{st}$ page data into the first flash memory;

immediately after the $1^{st}$ page data is programmed into the $0^{th}$ page of the first flash memory, transferring the $2^{nd}$ page data into the first flash memory;

immediately after the $2^{nd}$ page data is programmed into the $1^{st}$ page of the first flash memory, transferring the $3^{rd}$ page data into the first flash memory;

while the $3^{rd}$ page data is programmed into the $2^{nd}$ page of the first flash memory, transferring the $4^{th}$ page data into the second flash memory;

immediately after the $4^{th}$ page data is programmed into the $0^{th}$ page of the second flash memory, transferring the $5^{th}$ page data into the second flash memory; and immediately after the $5^{th}$ page data is programmed into the $1^{st}$ page of the second flash memory, transferring the $6^{th}$ page data into the second flash memory, programming the $6^{th}$ page data into the $2^{nd}$ page of the second flash memory.

4. A data transfer method, for transferring data having a $1^{st}$ page data, a $2^{nd}$ page data, a $3^{rd}$ page data, a $4^{th}$ page data, a $5^{th}$ page data, and a $6^{th}$ page data from a host system to a flash memory chip having a first flash memory and a second flash memory, wherein the first flash memory and the second flash memory respectively have a plurality of memory cell arrays, and each of the memory cell arrays at least has a lower page, a middle page and an upper page, wherein write speeds of the lower pages are greater than write speeds of the middle pages and the write speeds of the middle page are greater than write speeds of the upper pages, the data transfer method comprising:

transferring the $1^{st}$ page data into the first flash memory;

immediately after the $1^{st}$ page data is programmed into a $0^{th}$ page of the first flash memory, transferring the $2^{nd}$ page data into the first flash memory;

while the $2^{nd}$ page data is programmed into a $1^{st}$ page of the first flash memory, transferring the $4^{th}$ page data into the second flash memory;

immediately after the $4^{th}$ page data is programmed into a $0^{th}$ page of the second flash memory, transferring the $5^{th}$ page data into the second flash memory;

while the $5^{th}$ page data is programmed into a $1^{st}$ page of the second flash memory, transferring the $3^{rd}$ page data into the first flash memory;

while the $3^{rd}$ page data is programmed into a $2^{nd}$ page of the first flash memory, transferring the $6^{th}$ page data into the second flash memory; and programming the $6^{th}$ page data into a $2^{nd}$ page of the second flash memory, wherein the $0^{th}$ pages of the first flash memory and the second flash memory are the lower pages, the $1^{st}$ pages of the first flash memory and the second flash memory are the middle pages and the $2^{nd}$ pages of the first flash memory and the second flash memory are the upper pages, the $0^{th}$ page, the $1^{st}$ page and the $2^{nd}$ page of the first flash memory share a common memory cell, and the $0^{th}$ page, the $1^{st}$ page and the $2^{nd}$ page of the second flash memory share a common memory cell.

* * * * *